(12) United States Patent
Seo et al.

(10) Patent No.: US 7,569,307 B2
(45) Date of Patent: Aug. 4, 2009

(54) LASER MASK AND CRYSTALLIZATION METHOD USING THE SAME

(75) Inventors: Hyun Sik Seo, Gyeonggi-Do (KR); Yun Ho Jung, Seoul (KR); Young Joo Kim, Gyeonggi-Do (KR); JaeSung You, Seoul (KR)

(73) Assignee: LG Display Co., Ltd., Seoul (KR)

( * ) Notice: Subject to any disclaimer, the term of this patent is extended or adjusted under 35 U.S.C. 154(b) by 245 days.

(21) Appl. No.: 11/016,782

(22) Filed: Dec. 21, 2004

(65) Prior Publication Data

US 2005/0142453 A1 Jun. 30, 2005

(30) Foreign Application Priority Data

Dec. 24, 2003 (KR) .................. 10-2003-0096872

(51) Int. Cl.
*H01L 21/84* (2006.01)
(52) U.S. Cl. .................. 430/5; 438/166; 250/492.22; 257/E21.561

(58) Field of Classification Search .............. 438/30, 438/151–166; 430/5; 250/492.22; 257/E21.561
See application file for complete search history.

(56) References Cited

U.S. PATENT DOCUMENTS

| 6,736,895 | B2 * | 5/2004 | Jung | .................. 117/37 |
| 2004/0127066 | A1 * | 7/2004 | Jung | .................. 438/778 |
| 2005/0124145 | A1 * | 6/2005 | Jung | .................. 438/487 |
| 2005/0142450 | A1 * | 6/2005 | Jung | .................. 430/5 |

* cited by examiner

*Primary Examiner*—Richard A. Booth
(74) *Attorney, Agent, or Firm*—Birch, Stewart, Kolasch & Birch, LLP

(57) ABSTRACT

A laser mask includes a mask pattern with edges having inverted shapes to alleviate the effects of diffraction of laser beams to reduce overlap regions such that crystallization characteristics are improved. The laser mask includes a mask pattern that includes transmitting regions and a blocking region. The edges of the mask have shapes inverted to the shapes of the edges of a silicon thin film crystallized by the pattern.

6 Claims, 12 Drawing Sheets

LASER MASK AND CRYSTALLIZATION METHOD USING THE SAME

BACKGROUND OF THE INVENTION

This application claims priority under 35 U.S.C. § 119(a) on Patent Application No. 2003-96872 filed in Korea on Dec. 24, 2003, the entire contents of which are hereby incorporated by reference.

1. Field of the Invention

The invention relates to a laser mask and a crystallization method using the same, and more particularly, to a laser mask whose shape is improved to reduce crystallization overlap regions such that the crystallization characteristics are improved.

2. Discussion of the Related Art

More attention has been recently paid to information display, and the desire to use portable information media increases. Attention has concentrated on the research and commercialization of a light and thin flat panel display (FPD) that replaces a cathode ray tube (CRT) used as a conventional display. In particular, among such FPDs, a liquid crystal display (LCD) device that displays images using the optical anisotropy of liquid crystals has high resolution, high quality of color display, and high picture quality such that LCD devices find applications as notebooks or desktop monitors.

An active matrix (AM) driving method is mainly used for liquid crystal display devices, where an amorphous silicon thin film transistor (TFT) is used as a switching element to drive the liquid crystal pixel portion.

An amorphous silicon TFT technology was conceptualized by LeComber et al. in 1979 and was commercialized as a three-inch liquid crystal portable television in 1986. Recently, a no less than 50-inch large TFT liquid crystal display device has been developed.

However, there is a limit to using an amorphous silicon TFT with an electrical mobility of <1 cm$^2$/Vsec, which arises from a peripheral circuit that requires a high speed operation of no less than 1 MHz. Therefore, research has focused on simultaneous integration of a pixel portion with a driving circuit portion on a glass substrate using a polycrystalline silicon TFT (whose field effect mobility is larger than that of amorphous silicon TFT).

Polycrystalline silicon TFT technology has been applied to small modules such as camcorders since the liquid crystal color television was developed in 1982. A polycrystalline silicon TFT has low photosensitivity and high field effect mobility such that a driving circuit can be directly manufactured on a substrate.

Increasing mobility improves the operating frequency of the driving circuit that determines the number of driving pixels, such that it is possible to easily make a display having a fine pixel structure. Also, the time in which a signal voltage is charged to the pixel portion is reduced to thereby reduce the distortion of the transmitted signal such that improved picture quality can be expected.

Also, since the polycrystalline silicon TFT can be driven by a voltage of less than 10V, compared with the amorphous silicon TFT that has a high driving voltage of 25V, it becomes possible to reduce power consumption.

On the other hand, in order to manufacture the above-described polycrystalline silicon TFT, one uses a method of directly depositing a polycrystalline silicon thin film, a method of depositing an amorphous silicon thin film on a substrate, and performing thermal treatment on the amorphous silicon thin film to perform crystallization. In particular, a low temperature process is required in order to use an inexpensive glass substrate. In order to use an amorphous silicon TFT as an element of the driving circuit, it is necessary to increase the field effect mobility of the amorphous silicon TFT.

The current thermal treatment method for crystallizing the amorphous silicon thin film is divided into a solid phase crystallization (SPC) method and an eximer laser annealing (ELA) method.

According to the SPC method of forming a polycrystalline silicon thin film, after forming an amorphous silicon thin film on a glass substrate, the amorphous silicon thin film is heated at about 600° C. for several hours to dozens of hours to crystallize the amorphous silicon thin film. The polycrystalline silicon thin film obtained by the SPC method has relatively large grains, each having a size of several μm with many defects. The defects are known to have a bad effect on the performance of a TFT next to a gray boundary.

According to the eximer laser annealing method that is the basic method of manufacturing a polycrystalline silicon thin film at low temperature, a high-energy laser beam is instantaneously irradiated onto the amorphous silicon thin film for dozens of nsec to melt and crystallize the amorphous silicon thin film. Since amorphous silicon is melt and crystallized for a very short time period, the glass substrate is not damaged at all.

Also, the polycrystalline silicon thin film manufactured using eximer laser radiation has excellent electrical characteristics compared with the polycrystalline silicon thin film manufactured by the commonly used thermal treatment method. For example, the field effect mobility of the amorphous silicon TFT is about 0.1 to 0.2 cm$^2$/Vsec, and the field effect mobility of the polycrystalline silicon TFT manufactured by a common thermal treatment method is about 10 to 20 cm$^2$/Vsec. In comparison, the field effect mobility of the polycrystalline silicon TFT manufactured using the eximer laser exceeds 100 cm$^2$/Vsec (IEEE Trans. Electron Devices, vol. 36, no. 12, p. 2868, 1989).

Hereinafter, a crystallization method using laser radiation will be described in detail.

FIG. 1 shows a graph illustrating the sizes of grains of a crystallized silicon thin film with respect to the density of radiated laser energy.

FIG. 1 has a first region I and a second region II in which the sizes of the grains of the crystallized polycrystalline silicon thin film increase as the laser energy density increases (IEEE Electron Dev. Lett., DEL-7,276,1986). However, in a third region III, when energy having no less than specific energy density Ec is radiated, the sizes of the grains of the crystalline polycrystalline silicon thin film reduce significantly.

That is, the crystallization mechanism of a silicon thin film varies with the density of the radiated laser energy, which will be described in detail.

FIGS. 2 to 4 depict sectional views illustrating a silicon crystallization mechanism in accordance with the laser energy density in the graph illustrated in FIG. 1, and which sequentially illustrate crystallization processes in accordance with the respective laser energy densities.

The crystallization mechanism of amorphous silicon by laser annealing is affected by various factors including laser radiation conditions such as laser energy density, radiation pressure, substrate temperature and the physical and geometric characteristics of the amorphous silicon thin film including absorption coefficient, heat conductivity, mass, impurity content, and thickness.

First, FIGS. 2A to 2C show that the first region I of the graph of FIG. 1 is a partial melting region, in which the crystallization of an amorphous silicon thin film 12 is performed only on the portion denoted by a dotted line. At this time, the size of a grain 30 of the grain structure is about several hundreds of Å.

That is, when the laser of the first region I radiates onto the amorphous silicon thin film 12 on a substrate 10 on which a buffer layer 11 is formed, the amorphous silicon thin film 12 melts. Strong laser energy radiates onto the surface of the amorphous silicon thin film 12 directly exposed to a laser beam, and relatively weak laser energy radiates onto the lower portion of the amorphous silicon thin film 12 such that only a predetermined portion of the amorphous silicon thin film 12 melts to perform partial crystallization.

In this laser crystallization crystal growing process, the surface of amorphous silicon first primarily melts by laser radiation. Second, latent heat generates by the solidification of the primary melting layer and accordingly a lower layer secondarily melts. Third, crystals grow by solidification. This crystal growing processes will be described in detail.

The temperature of the amorphous silicon thin film onto which laser light radiates is greater than the melting temperature of 1,000° C., such that the amorphous silicon film primarily melts to be liquid. Subsequently, the primary melting layer rapidly cools until a large difference is generated between the temperature of lower silicon and the temperature of the substrate, such that solid phase nucleation and solidification occur. The melting layer obtained laser radiation laser persists until solid phase nucleation and solidification occur. As long as ablation does not occur, the higher the laser energy density is or the smaller the amount of heat emitted to the outside is, the longer such a melting state is maintained. Also, since the primary melting layer melts at a temperature of 1,000° C., which is lower than the 1,400° C. melting temperature of crystalline silicon, the melting layer cools to be maintained in a super-cooled state where the temperature falls below the phase-transition temperature. The greater the super-cooled state, that is, the lower the melting temperature of the thin film (or faster the cooling speed is), the larger the solid phase nucleation rate becomes. Thus, it is possible to grow fine crystals.

When the primary melting layer is cooled to start solidification, crystals grow in an upward direction based on crystal nuclei. At this time, latent heat emits in accordance with the liquid phase to solid phase change of the primary melting layer, such that the lower amorphous silicon thin film secondarily melts and resolidifies. Repeating such processes grows the crystals. At this time, the lower secondary melting layer is more super-cooled than the primary melting layer such that the nucleus generating rate increases to reduce the size of the crystals.

Therefore, reducing the cooling speed during solidification improves the crystallization characteristics during crystallization by laser annealing. Accordingly, one may suppress the emission of the heat of the absorbed laser energy to the outside by heating the substrate, by irradiating a dual beam, and by inserting a buffer insulating layer to reduce the cooling speed.

FIGS. 3A to 3C show sectional views sequentially illustrating the silicon crystallization mechanism with respect to the second region II of the graph of FIG. 1. The second region II represents a near-complete melting region.

FIGS. 3A to 3C show a polycrystalline silicon thin film that has relatively large grains 30A, 30B, 30C of about 3,000 to 4,000 Å formed at the interface of the lower buffer layer 11. At this time, unmelted solid seeds 35 exist in the interface between the melting silicon thin film 12' and the buffer layer 11, and the seeds operate as crystallization nuclei to produce horizontally grown crystals having relatively large grains 30A, 30B, 30C (J. Appl. Phys. 82, 4086).

However, the process window is very narrow since the crystallization can be performed only by irradiating laser energy that may remain on the interface between the melting silicon thin film 12' and the buffer layer 11 onto the solid seeds 35 that are not to melt. Also, since the solid seeds 35 are non-uniform, the crystallized grains 30A to 30C of the polycrystalline silicon thin film have different crystallization directions, and hence, different crystallization characteristics.

Finally, FIGS. 4A to 4C show sectional views illustrating a crystallization mechanism with respect to a complete melting region represented by the third region III of the graph of FIG. 1.

As illustrated in FIGS. 4A to 4C, the energy density corresponding to the third region III results in the formation of very small grains 30.

That is, when the laser energy density is no less than a predetermined level Ec, sufficient energy is applied to the amorphous silicon thin film 12 such that the amorphous silicon thin film 12 completely melts. As a result, solid seeds that can grow to become grains are not present. Then, the silicon thin film 12' onto which strong laser energy is irradiated melts the silicon thin film 12' such that it undergoes a rapid cooling process in which uniform nuclei 30 are generated. As a result, fine grains 30 are formed.

On the other hand, in order perform the laser crystallization, an eximer laser annealing method using a pulse-shaped laser finds predominant use. However, a sequential lateral solidification (SLS) method in which grains are laterally grown to significantly improve the crystallization characteristics has recently been suggested and is under active study.

The observation that grains are vertically grown with respect to a boundary between liquid phase silicon and solid phase silicon on the boundary (Robert S. Sposilli, M. A. Crowder, and James S. Im, Mat. Res. Soc. Symp. Proc. Vol. 452,956-957, 1997) is used as a basis for an SLS method. According to this SLS method, the magnitude of laser energy and a range in which a laser beam is irradiated are properly controlled to laterally grow grains having a predetermined length such that the size of the silicon grains can be increased.

Such an SLS method will be described in detail with reference to FIGS. 5A to 5C, which are sectional views sequentially illustrating crystallization processes in accordance with the SLS method.

FIG. 5A shows that when a laser having no less than the energy density (that is, the above described third region III of FIG. 1) in which the amorphous silicon thin film 112 is irradiated such that it completely melts.

At this time, the region onto which laser light irradiates and the region onto which laser light is not radiated are formed via a patterned mask.

FIGS. 5B and 5C show that since laser of sufficient energy is irradiated onto the amorphous silicon thin film 112, the amorphous silicon thin film 112 completely melts. However, since the amorphous silicon thin film 112 melts using beams spaced at uniform intervals, crystals are grown using solid phase silicon that exists at the boundaries between the silicon thin film 112 onto which laser light is not irradiated, and the melting silicon thin film 112' has nuclei.

That is, immediately after the radiation of laser energy is complete, the melted silicon thin film 112' is cooled starting at the right and left surfaces, which are regions onto which laser is not irradiated. This occurs because the solid phase silicon thin film 112 has larger heat conductivity on the right and left surfaces than the heat conductivity of the buffer layer 111 or the glass substrate 110 under the silicon thin films 112 and 112'.

Therefore, in the silicon thin film melt 112', the right and left solid phase and liquid phase interfaces first reach the nucleus forming temperature before the central portion, such that the crystal nuclei are formed in the right and left portions. After the crystal nuclei are formed, grains 130A and 130B grow laterally from the sides that have lower temperature toward the region with higher temperature. That is, crystals grow from the interfaces to the central portion.

Larger grains 130A and 130B are formed due to this lateral growth of crystals, and processes using the energy of the third region III create a wide process window.

On the other hand, a slit shaped mask that has a region that transmits light and a region that blocks light is used for the laser crystallization, which will be described in detail below.

FIG. 6A depicts a plan view illustrating an example of a conventional laser mask. FIG. 6A shows that the laser mask 270 has a slit pattern 275 that contains rectangular transmitting regions 273 with predetermined width and length.

That is, the laser mask 270 has rectangular transmitting regions 273 that transmit light and a blocking region 274 that blocks light. The laser beam that transmits through the transmitting regions 273 of the slit pattern 275 crystallizes a predetermined silicon thin film area in the shape (that is, a rectangle) of the slit pattern 275.

However, as illustrated in FIG. 6B, the edge E of the crystallized silicon thin film does not actually crystallize in the shape of a mask pattern. That is, the slit pattern 275 becomes rounded due to the diffraction of the laser, which will be described in detail below.

In FIG. 6B, the dotted line at the edge E of the crystallized silicon thin film denotes the shape of the slit pattern 275 of the mask 270 used for the crystallization.

FIG. 7 shows a plan view illustrating an enlargement of the edge E of the crystallized silicon thin film illustrated in FIG. 6B. FIG. 7 shows that since complete melting energy that entirely melts the silicon thin film is irradiated onto the central region A of the edge E, a crystallized pattern is formed having the same shape as the slit pattern 275. However, the laser beam diffracts at the edge of the slit pattern 275 corresponding to the corner B of the edge E, such that partial melting energy (that does not completely melt the silicon thin film) is irradiated onto the corner of the edge. As a result, the edge E of the crystallized thin film becomes convex.

This occurs because the edge E of the crystallized silicon thin film grows by using the amorphous silicon thin film positioned on the boundary (and that melts to be round) as a nucleus, and a second grain 230B that grows in a different direction from the direction of the first grain 230A is consequently formed. That is, the second grain 230B has different crystallization characteristics from those of the first grain 230A. As a result, discontinuous regions with different crystallization characteristics are found in the crystallized silicon thin film.

At this time, the discontinuous region forming the convex edge E of the crystallized silicon thin film has different crystallization characteristics along the width W thereof, and in order to apply the silicon thin film to a liquid crystal display device, it is necessary to reduce the width of the discontinuous region.

Alternately, common processes of crystallizing a silicon thin film using the above-described mask will be described below.

FIGS. 8A to 8C show plan views sequentially illustrating processes of crystallizing the silicon thin film using the related art mask illustrated in FIG. 6A.

FIG. 8A shows the mask 270 illustrated in FIG. 6A being positioned on a substrate 210. A first laser beam is irradiated onto the mask 270 such that an amorphous silicon thin film 212 deposited on the substrate 210 crystallizes.

At this time, the crystallized regions correspond to the transmitting regions 273 of the mask 270. Two crystallized regions with predetermined length will form if it is assumed that two transmitting regions of the mask 270 are present.

That is, when the first laser beam irradiates onto the surface of the substrate 210 through the conventional mask 270 that has two rectangular slit patterns 275, the silicon thin film onto which the laser is radiated through the slit pattern 275 has a first grain 230A. This first grain 230A grows laterally with the amorphous silicon thin film 212 positioned on the up and down boundaries as a nucleus.

At this time, the edge of the crystallized silicon thin film 212' does not actually crystallize in the shape of the mask pattern. That is, the slit pattern 275 is rounded due to the diffraction of the laser beams described above. At the edge of the round crystallized silicon thin film 212', a second grain 230B grows using the amorphous silicon thin film 212 positioned on the round melting boundary as a nucleus. The second grain 230B therefore forms in a different direction from that of the first grain 230A.

That is, the second grain 230B has crystallization characteristics different from those of the first grain 230A, and a discontinuous region exists in the crystallized silicon thin film.

When the first crystallization is completed, a stage (not shown) on which the substrate 210 is placed (or alternately the mask 270) is moved less than the length of the mask pattern (that is, the slit pattern 275). Then, a second laser beam irradiates such that crystallization is continuously performed in the X-axis direction.

That is, for example, when the stage moves in the X-axis direction such that the slit pattern 275 overlaps the discontinuous regions 280 of the crystallized silicon thin film 212', and then the second laser beam irradiates the surface of the substrate 210, as illustrated in FIG. 8B, then second crystallized patterns 212" (which are identical to the silicon thin film patterns 212') laterally crystallize to overlap the discontinuous regions 280 of the primary crystallized silicon thin film 212'.

Subsequently, a third laser beam is irradiated onto the surface of the substrate 210 by the same method, and third crystallized patterns 212''', identical to the second crystallized silicon thin film patterns 212", overlap the discontinuous regions 280 of the second crystallized silicon thin films 212".

Consequently, the larger the width W of each of the discontinuous regions 280 becomes, the larger the overlap region of laser beams for the next shot results. As a result, the crystallization time increases. That is, the discontinuous regions 280 of the crystallized silicon thin films 212', 212", and 212''' have different crystallization characteristics such that the silicon thin film around the discontinuous regions 280 fails to crystallize and remains as amorphous silicon 212. Therefore, the next shot must be irradiated such that the discontinuous regions 280 overlap with each other.

After crystallization in the X-axis direction completes by the above method, the mask 270 (or the stage) moves in the Y-axis direction (in the −Y-axis direction when the stage is moved) by a predetermined distance.

As illustrated in FIG. 8C, a laser irradiation process is repeated on the portion on which the primary crystallizing process was performed in the horizontal direction.

When the crystallization is performed using the related art mask, the polycrystalline silicon thin film includes multiple first regions P1 that have normal grains, and multiple second regions P2 that exist between the first regions P1, and these second regions P2 are discontinuous regions with different crystallization characteristics.

The discontinuous regions with different crystallization characteristics make the liquid crystal display device manufactured from the crystallized thin film have non-uniform characteristics such that the quality of the liquid crystal display device deteriorates.

Also, when the crystallization is performed using the laser mask, the crystallized silicon thin film has edges at which discontinuous regions with different crystallization characteristics are formed due to the diffraction of laser beams. Therefore, the silicon thin film around the discontinuous regions does not crystallize and remains as amorphous silicon. Therefore, the next shot must be irradiated such that the discontinuous regions overlap. As a result, the larger the width of each of the discontinuous regions requires an increase in the overlap region of the laser beams for the next shot. Accordingly, the crystallization time increases.

SUMMARY OF THE INVENTION

In order to solve the above-described problems, it is an object of the present invention to provide a laser mask that has inverted edges to alleviate the effects of diffraction of a laser beam, thereby reducing overlap.

It is another object of the present invention to provide a liquid crystal display device manufactured using a crystallized silicon thin film with crystallization characteristics improved due to reduction in the overlap regions.

The invention, in part, pertains to a laser mask having a mask pattern that contains transmitting regions and a blocking region, and the mask pattern has edges having shapes invert to the shapes of the edges of a silicon thin film crystallized using the laser mask. One or more of the transmitting regions transmits laser beams. Also, multiple block-shaped transmitting regions of the mask pattern are formed in the mask.

In the invention, the block-shaped transmitting regions of the mask pattern are arranged to offset each other. The blocking region can be formed of a metal material that contains aluminum and blocks laser beams. The edges of the mask pattern can have concave shapes inverted to the convex shapes of edges of a crystallized silicon thin film. The edges of the mask pattern can have a concave shape such as a concave triangle, a concave arc, or a concave rectangle.

The invention, in part, pertains to a laser crystallization method that includes the steps of providing a substrate on which an amorphous silicon thin film is deposited, positioning a laser mask that includes a mask pattern that contains transmitting regions and a blocking region and whose edges have inverted shapes over the substrate, irradiating a first laser beam onto the surface of the substrate through the pattern of the laser mask to first crystallize a predetermined region of the silicon thin film, moving the laser mask or a stage on which the substrate is loaded in an X-axis direction to perform second crystallization using the laser mask, repeatedly performing the crystallization to the end of the substrate in the X-axis direction, moving the laser mask or the stage in the Y-axis direction, and repeatedly performing the crystallization in the Y-axis direction to complete crystallization.

In the invention, multiple block-shaped transmitting regions of the mask pattern are formed in the mask. The block-shaped transmitting regions of the mask pattern can be arranged to offset each other. Edges of the mask pattern can have concave shapes inverted to the convex shapes of edges of a crystallized silicon thin film. Also, the crystallization is lateral crystallization, sequential lateral crystallization or sequential lateral crystallization is sequential lateral crystallization to which a pulse duration extender (PDE) is applied. The invention features round regions of the edges of the silicon thin film crystallized using the laser mask being reduced. The round regions of the edges are reduced such that discontinuous regions with different crystallization characteristics are reduced. Further, a laser beam can be irradiated once using the laser mask and then the laser mask or the stage is moved in the X-axis direction or in the Y-axis direction by a predetermined distance. The laser mask or the stage can be moved in the X-axis direction such that the mask pattern overlaps the discontinuous regions of the crystallized silicon thin film.

The invention, in part, pertains to a liquid crystal display device that includes polycrystalline silicon active layers crystallized using a laser mask that includes a mask pattern that contains transmitting regions and a blocking region and whose edges have inverted shapes, gate electrodes formed over the active layers with a gate insulating film interposed, an interlayer insulating film formed over the gate electrodes which includes contact holes, and source/drain electrodes that are electrically connected to predetermined regions of the active layers through the contact holes. A Group V element such as P can be implanted into predetermined regions of the active layers to form N type source/drain regions. A Group III element such as B can be implanted into predetermined regions of the active layers to form P type source/drain regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the embodiments of the invention. In the drawings.

DETAILED DESCRIPTION

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 9:
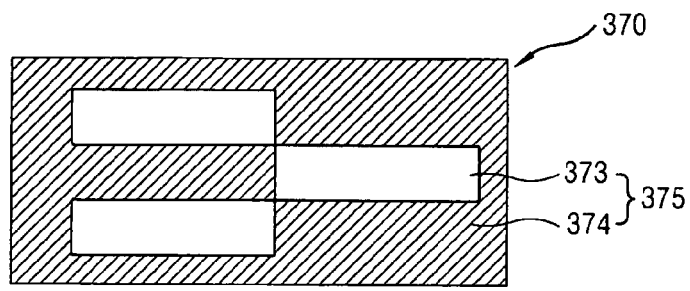
FIG. 9 shows a plan view illustrating a laser mask according to a first embodiment of the invention.

FIG. 9 shows a plan view of a laser mask according to the invention. The mask is designed to reduce crystallization time compared with the crystallization time required for related art crystallization processes.

FIG. 9 shows a laser mask 370 that has a slit pattern 375 in which rectangular transmitting regions 373 with predetermined width and length cross, i.e., offset, each other.

That is, the laser mask 370 has rectangular transmitting regions 373 that transmit light and a blocking region 374 that blocks light.

The laser mask 370 forms a two-block laser mask in which the transmitting regions 373 of the slit pattern 375 align such that two transmitting regions 373 are formed on the left side of the mask 370 and that one transmitting region 373 is formed on the right side of the mask 370.

The above-described two-block laser mask 370 divides into two blocks such that two shot horizontal crystallization can be performed by a single scan in the X-axis direction.

A processes of crystallizing a silicon thin film using the above-described laser mask 370 will be now be described.

Figure 10A:
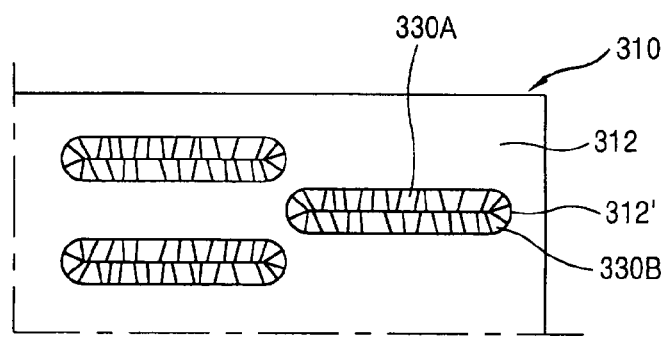
FIGS. 10A and 10B show plan views schematically illustrating processes of crystallizing a silicon thin film using the mask illustrated in FIG. 9.
Figure 10B:
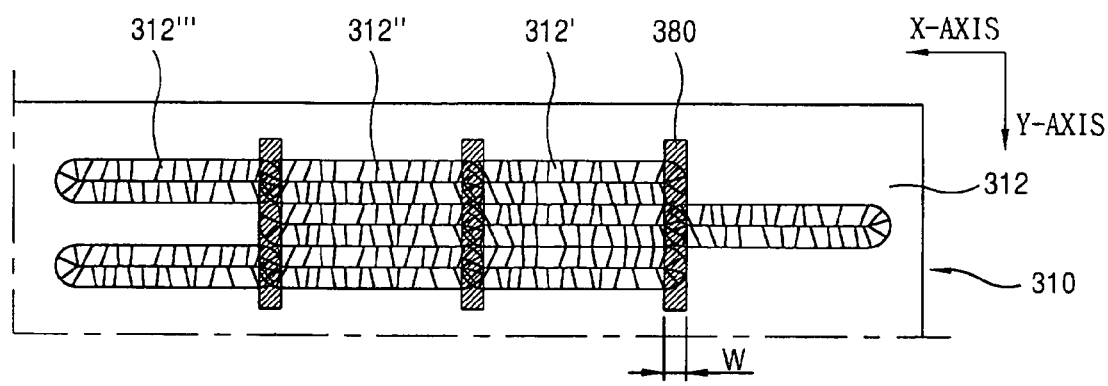

FIGS. 10A and 10B show plan views schematically illustrating a process of crystallizing a silicon thin film using the mask illustrated in FIG. 9A.

A first laser beam is irradiated onto the surface of a substrate 310 over which the above-described two-block laser mask 370 applied, as illustrated in FIG. 10A. The silicon thin film onto which the first laser is irradiated through the slit pattern 375 (that is, through the transmitting regions 373 of the slit pattern 375) has a first grain 330A that is laterally grown using an amorphous silicon thin film 312 positioned on the up and down boundaries as a nucleus.

At this time, the edge of the crystallized silicon thin film 312' does not actually crystallize in the shape of a mask pattern. That is, the rectangular slit pattern 375 does not transmit perfectly as illustrated in FIG. 10A, but the image is rounded at the corners due to the diffraction of the laser beam.

As a result, concentrated melting energy that completely melts the silicon thin film irradiates onto the central region of the edge, and the crystallization pattern forms to be similar to the slit pattern 375. However, the laser beam diffracts at the corner of the edge such that a laser beam having no more than the partial melting energy (that does not completely melt the silicon thin film) irradiates onto the corner of the edge. As a result, the edge becomes convex.

On the other hand, the regions crystallized by the first crystallization correspond to the transmitting regions 373 of the mask 370. When it is assumed that three transmitting regions of the mask 370 are present, three crystallized regions (that is, two crystallized regions and one crystallized region arranged to be offset) with predetermined length will be formed.

When the first crystallization is completed, a stage (not shown) on which the substrate 310 is placed or the mask 370 is moved less than the length of the mask 370 pattern (that is, the slit pattern 375). Then, a second laser beam is irradiated such that crystallization is continuously performed in the X-axis direction.

The movement distance, i.e., the displacement of the stage, is determined such that the edges of the transmitting regions overlap the crystallized regions.

That is, for example, when the stage is moved to the X-axis direction such that the slit pattern 375 overlaps the discontinuous regions 380 of the crystallized silicon thin film 312'. Then, the second laser beam is irradiated onto the surface of the substrate 310, as illustrated in FIG. 10B, and second crystallized patterns 312" (identical with the silicon thin film patterns 312' crystallized by the primary crystallization) are horizontally formed to overlap the discontinuous regions 380 of the first crystallized silicon thin film 312'.

Afterwards, a third laser beam is irradiated onto the surface of the substrate 310 by the same method, and third crystallized patterns 312''' (identical to the second crystallized silicon thin film patterns 312") overlap the discontinuous regions 380 of the second crystallized silicon thin films 312".

When the crystallization in the X-axis direction is complete, the mask 370 or the stage is moved in the Y-axis direction (in the −Y-axis direction when the stage is moved) for a predetermined distance (not shown). Then, the laser irradiating process is reperformed on the portion on which the primary crystallizing process was performed in the horizontal direction.

When crystallization is performed in the X axis direction and in the Y axis direction by the above-described method, crystallization over an entire selected region is performed.

This inventive crystallization method uses a crystallization time that is shorter than the crystallization time in related art technologies with respect to crystallizing the same area. As a result, it becomes possible to improve production yield.

However, the edges of the crystallized silicon thin films 312', 312", and 312''' are not actually crystallized in the shape of the mask pattern. That is, the rectangular slit pattern 375 does not transmit with true verisimilitude, due to the diffraction of the laser beams, but are rounded as illustrated in the drawing.

Therefore, the discontinuous regions, that are the convex edges of the crystallized silicon thin films 312', 312", and 312''', have different crystallization characteristics by the width thereof, and it is necessary to reduce the width of the discontinuous regions.

Therefore, according to the present invention, a laser mask in which edges are inverted in consideration of the diffraction of the laser beams, such that the overlap regions are reduced, and a crystallization method using the same are provided.

That is, the silicon thin film crystallizes to correspond to the edges of the slit pattern but becomes convex due to the diffraction of the laser beams, and the crystallization structure also becomes convex. If the edges of the slit have a shape that is inverted to the convex shape, i.e., a concave shape, then it is possible to reduce the crystallization time and to reduce the overlap regions.

Hereinafter, preferred embodiments of the laser mask according to the invention and the crystallization method using the same will be described in detail.

Figure 11A:
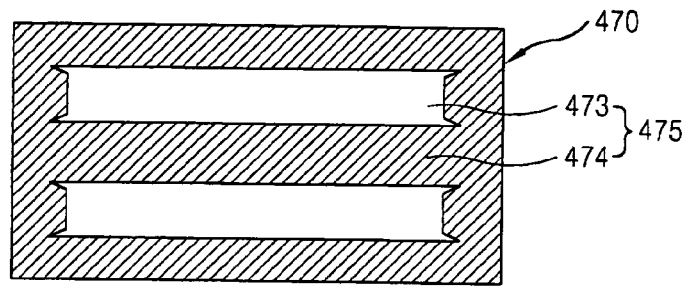
FIG. 11A shows a plan view illustrating a laser mask according to a second embodiment of the invention.

FIG. 11A shows a sectional view illustrating a laser mask according to a first embodiment of the invention. An improved laser mask having a novel shape of the edges of the slit pattern is illustrated.

FIG. 11A shows a laser mask 470 that has transmitting regions 473 with concave edges that transmit light and a blocking region 474 that blocks light.

The mask 470 blocks all of the laser beams incident on the blocking region 474 excluding that transmitting regions 473 of the slit pattern 475 formed in the center thereof. The mask 470 may be formed of aluminum or aluminum based alloy that effectively blocks laser beams and that has high reflectance. However, the invention is not restricted to aluminum, and any suitable mask material can be used. Also, organic materials can be used to form the mask.

Figure 11B:
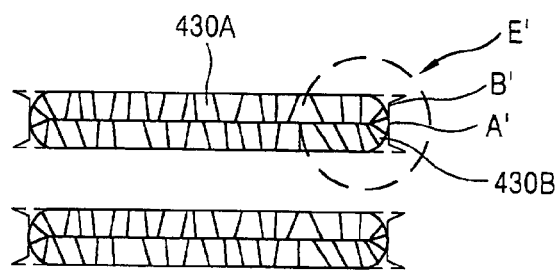
FIG. 11B shows a plan view schematically illustrating the crystallization shape of the silicon thin film crystallized using the mask illustrated in FIG. 11A.

FIG. 11B shows a plan view schematically illustrating the crystallization shape of the silicon thin film crystallized using the mask illustrated in FIG. 11A. As illustrated in FIG. 11B, the silicon thin film onto which laser is irradiated through the slit pattern 475 (that is, through the transmitting regions 473 of the slit pattern 475) has a first grain 430A that is horizontally grown using the amorphous silicon thin film positioned on the up and down boundaries as a nucleus.

Figure 1:
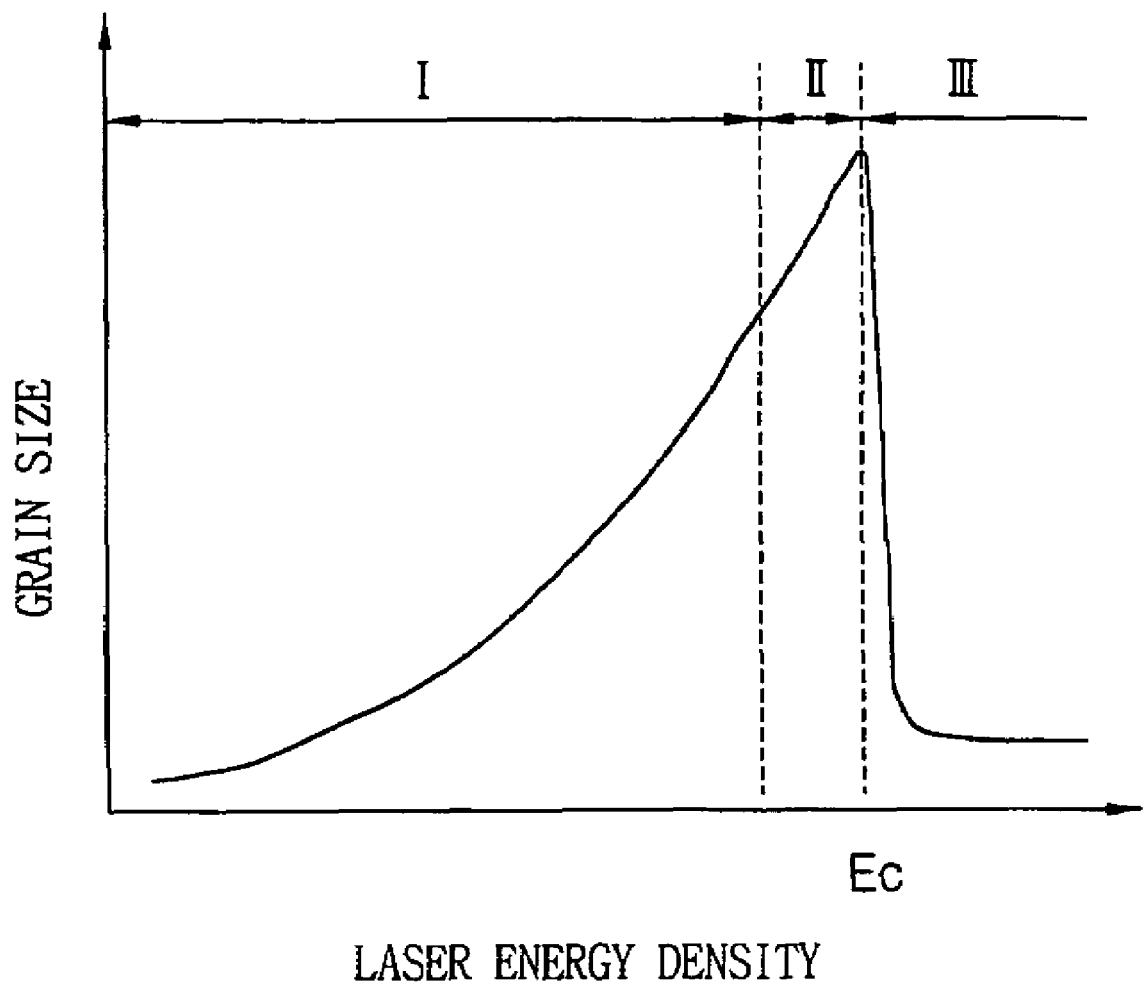
FIG. 1 shows a graph illustrating the size of a grain of a crystallized silicon thin film with respect to the density of radiated laser energy.
Figure 2A:
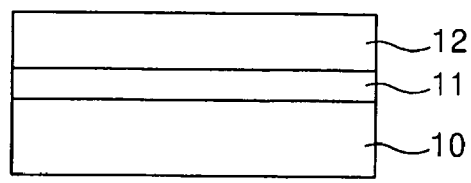
FIGS. 2, 3 and 4 depict sectional views illustrating silicon crystallization mechanism in accordance with laser energy density in the graph illustrated in FIG. 1.
Figure 2B:
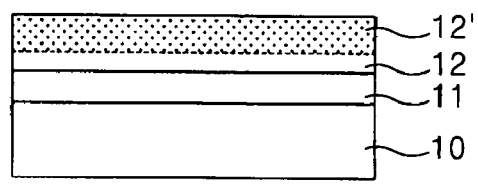
Figure 2C:
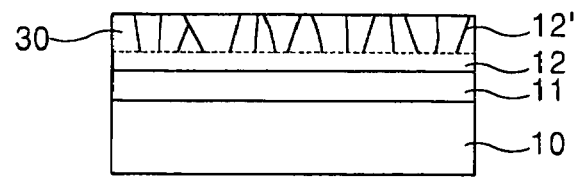
Figure 3A:
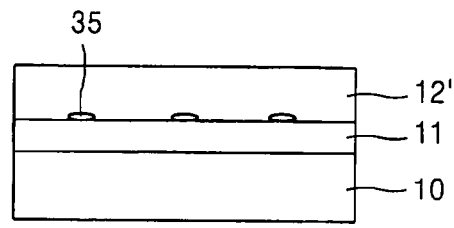
Figure 3B:
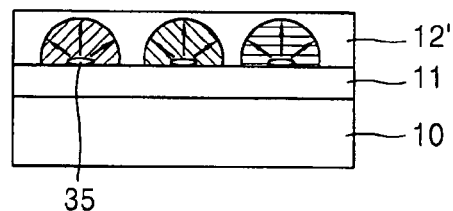
Figure 3C:
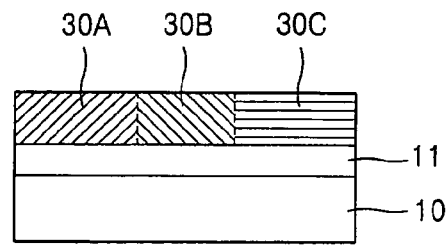
Figure 4A:
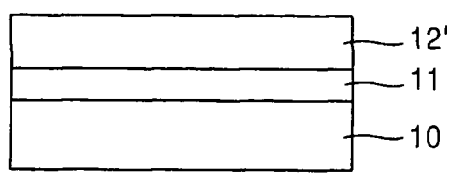
Figure 4B:
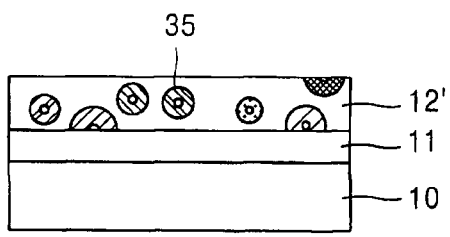
Figure 4C:
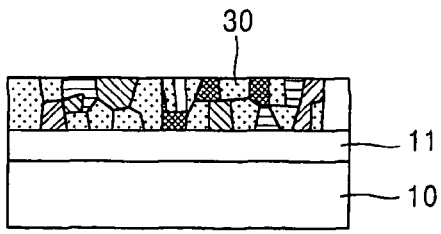
Figure 5A:
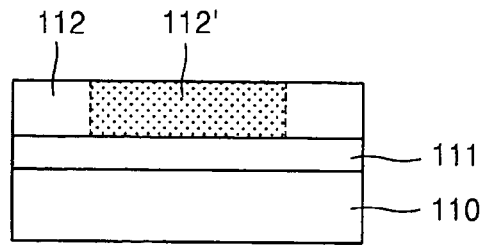
FIGS. 5A to 5C show sectional views sequentially illustrating crystallization processes in accordance with lateral crystallization.
Figure 5B:
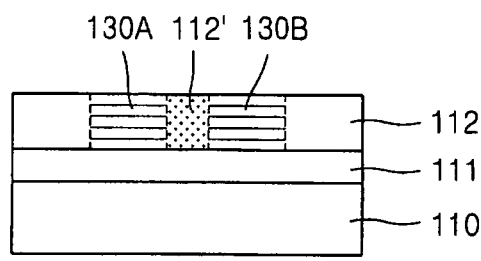
Figure 5C:
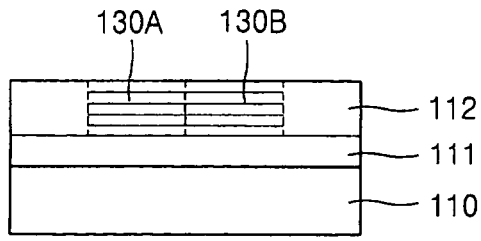
Figure 6A:
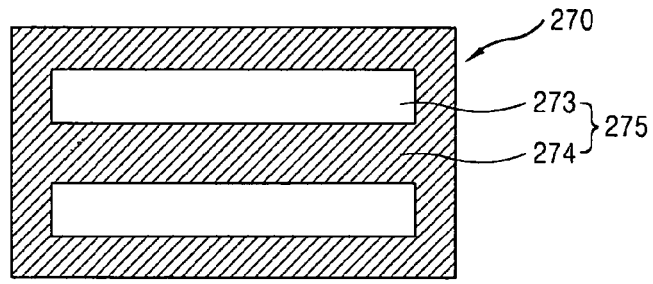
FIG. 6A shows a plan view illustrating a related art laser mask.
Figure 6B:
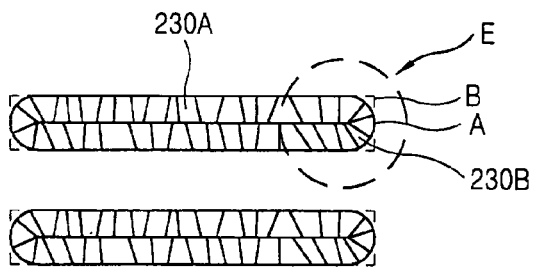
FIG. 6B shows a plan view schematically illustrating the crystallization shape of a silicon thin film crystallized using the mask illustrated in FIG. 6A.
Figure 7:
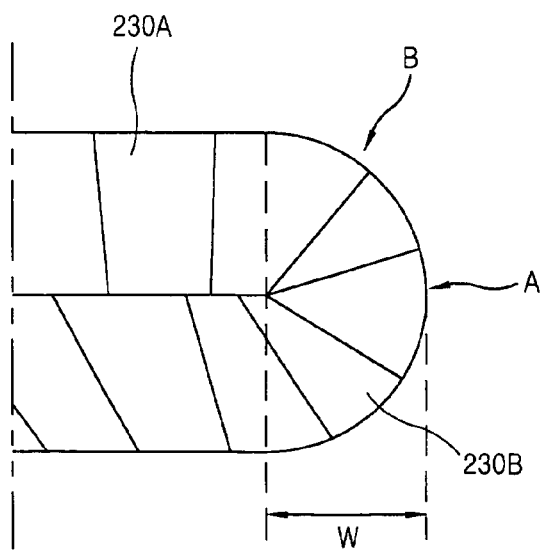
FIG. 7 shows a plan view illustrating an enlargement of the portion E of the crystallized silicon thin film illustrated in FIG. 6B.
Figure 8A:
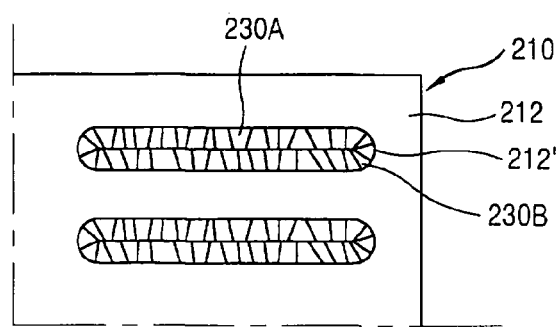
FIGS. 8A to 8C show plan views sequentially illustrating processes of crystallizing a silicon thin film using the mask illustrated in FIG. 6A.
Figure 8B:
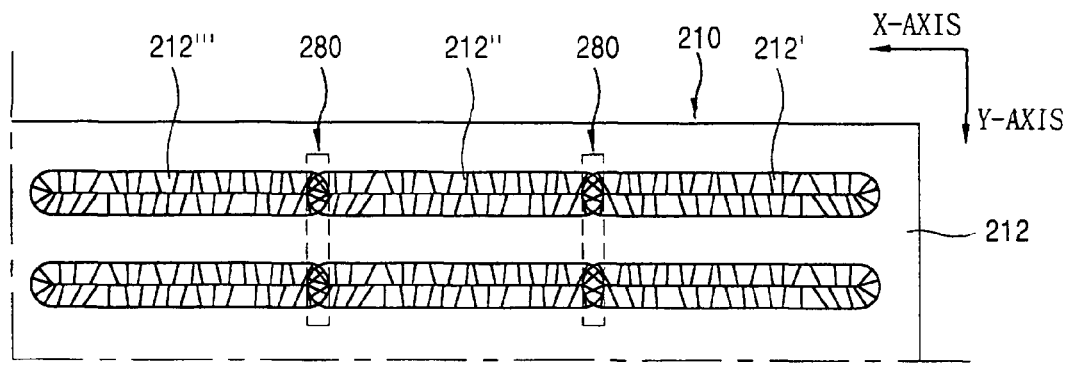
Figure 8C:
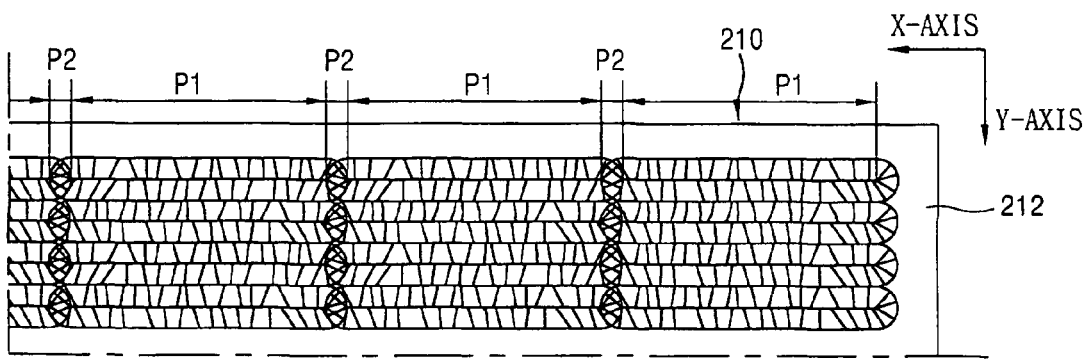

FIG. 1B shows the dotted line in the edge E' of the crystallized silicon thin film that denotes the shape of the slit pattern 475 of the mask 470 used for the crystallization.

Figure 12:
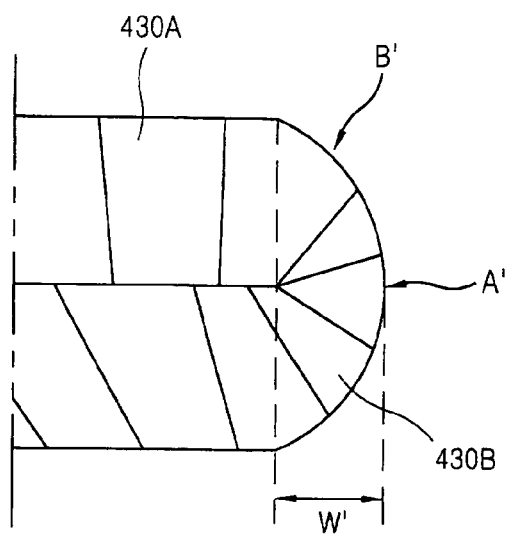
FIG. 12 shows a plan view illustrating an enlargement of the portion E of the crystallized silicon thin film illustrated in FIG. 11B.

The edge of the slit pattern 475 of the laser mask 470 is formed to have a concave shape, i.e., inverted, shape, as illustrated in FIG. 12. Using this configuration, melting energy that completely melts the silicon thin film irradiates onto the central region A' of the edge E', and a crystallization pattern similar to the slit pattern 475 is formed.

At this time, the laser beams transmitting the edge of the slit pattern 475 (that corresponds to the corner B' of the edge E') diffract such that the silicon thin film does not completely melt. However, minimizing the round portion of the crystallized silicon thin film becomes possible by making the edge of the slit pattern 475 in the shape of the narrowest slit.

That is, as illustrated in FIG. 12, the width W' of the discontinuous region in which a second grain 430B that grows in a different direction from the direction in which the first grain 430A is significantly smaller than the width W of the related art discontinuous region.

Figure 13A:
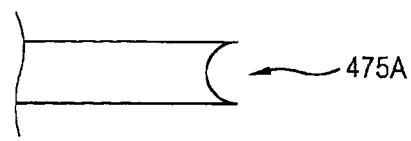
FIGS. 13A to 13C illustrate the forms of slits of laser masks according to the invention.
Figure 13B:
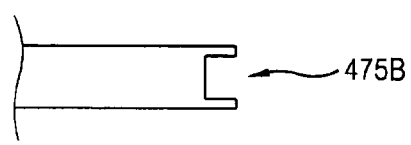
Figure 13C:
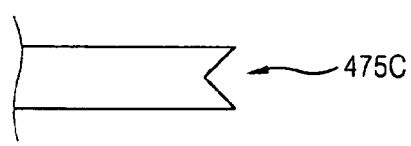

FIGS. 13A to 13C illustrate some of the possible shapes of the slit patterns of the laser masks according to the invention. In FIGS. 13A to 13C, slit patterns 475A to 475C have edges in various concave shapes such as concave triangular, concave round, and concave rectangular edges are illustrated. However, the invention is not restricted to these shapes, and any appropriate concave or non-concave shape can be used.

As described above, the edges of the crystallized silicon thin film have convex discontinuous regions due to the diffraction of the laser beams at the corners of the edges of the slit pattern. In order to solve this problem, the invention uses edges of the slit pattern that have concave shapes that are inverted to the convex shapes of the thin film.

Now, another embodiment that reduces the crystallization time by applying the above-described concave slit pattern to a block mask will be described.

Figure 14:
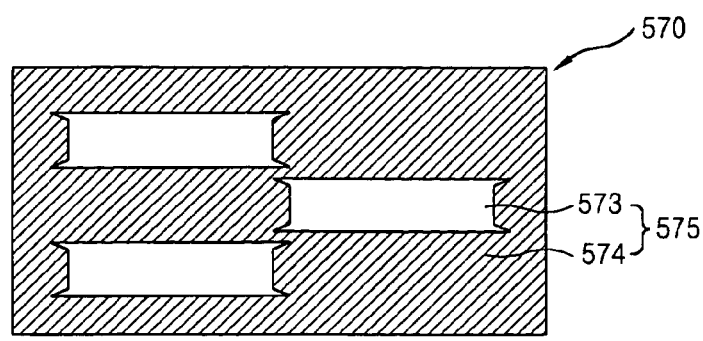
FIG. 14 shows a plan view illustrating a laser mask according to a third embodiment of the invention.

FIG. 14 shows a plan view illustrating a laser mask according to a second embodiment of the invention. A two-block laser mask capable of performing two-shot horizontal crystallization by a single scan in the X-axis direction is illustrated.

As illustrated in FIG. 14, a laser mask 570 includes a slit pattern 575 in which offset transmitting regions 573 have concave edges with predetermined width and length.

The laser mask 570 is a two-block laser mask that has transmitting regions 573 with concave edges that transmit light. A blocking region 574 blocks light such that two transmitting regions 573 are arranged on the left side of the laser mask 570, and one transmitting region 573 is arranged on the right side of the laser mask 570 to offset each other.

A process of crystallizing a silicon thin film using the laser mask 570 of the above-described structure will be described below.

Figure 15A:
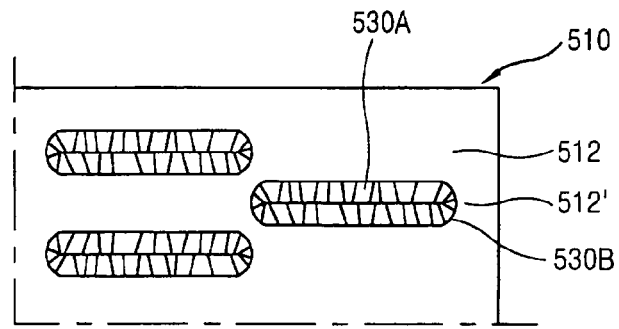
FIGS. 15A to 15C show plan views sequentially illustrating processes of crystallizing a silicon thin film using the mask illustrated in FIG. 14.
Figure 15B:
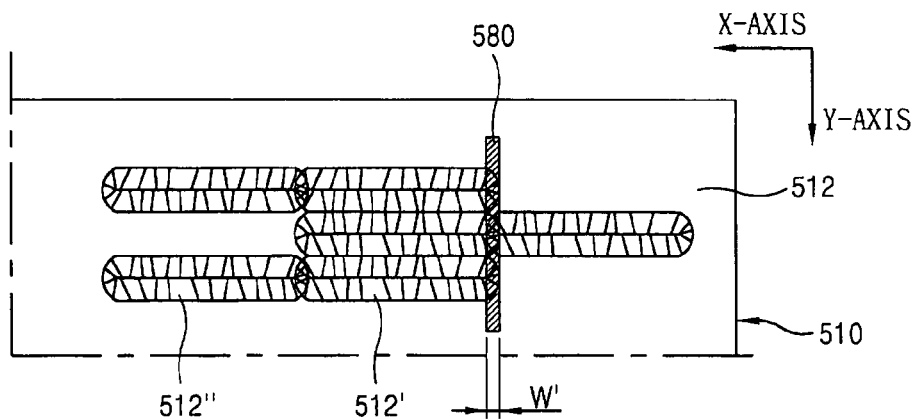
Figure 15C:
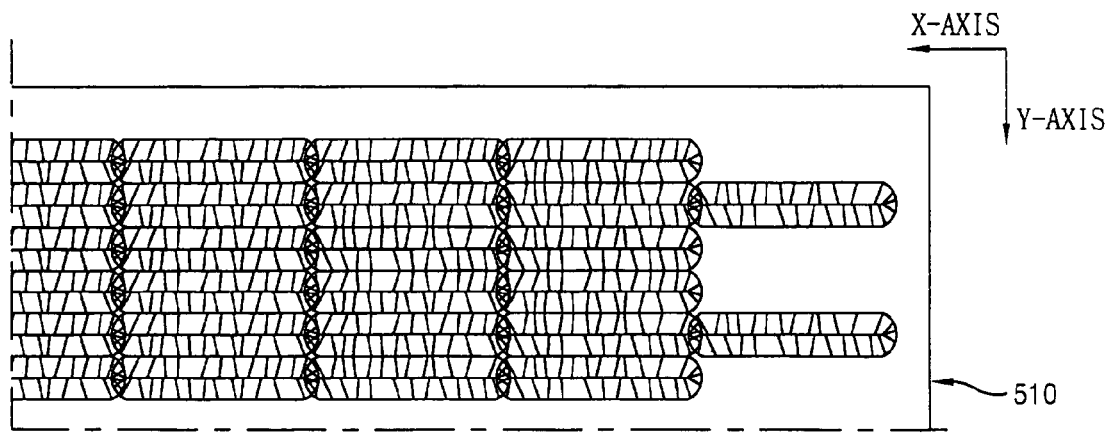

FIGS. 15A to 15C show plan views sequentially illustrating a process of crystallizing a silicon thin film using the mask illustrated in FIG. 14.

FIG. 15A shows that when a first laser beam is irradiated onto the surface of a substrate 510 under the above-described two-block laser mask 570, the silicon thin film onto which the first laser is irradiated through the slit pattern 575 (that is, through the transmitting regions 573 of the slit pattern 575) has a first grain structure 530A that is laterally grown using an amorphous silicon thin film 512 positioned on the up and down boundaries as a nucleus.

The edge of the crystallized silicon thin film 512' has a round shape with a width smaller than the width of the related art round shape due to the inventive concave slit pattern 575, which is designed to minimize the effects of the diffraction of the laser beams. That is, the round portion whose width is reduced has a second grain 530B that has different crystallization characteristics from the crystallization characteristics of the first grain 530A. The width of the round portion is substantially smaller than the width of the related art round portion.

The regions crystallized by the first crystallization correspond to the transmitting regions 573 of the mask 570. If three transmitting regions of the mask 570 are formed, then three crystallized regions (that is, two spaced side-by-side crystallized regions and one offset crystallized region) with predetermined length will be formed. However, the number of transmitting regions on the mask is not restricted to three, and any appropriate number of transmitting regions can be used.

When the first crystallization is completed, a stage (not shown) on which the substrate 510 is placed or the mask 570 itself is moved less than the length of the mask pattern (that is, the slit pattern 575). Then, a second laser beam is irradiated such that crystallization is continuously performed in the X-axis direction.

The movement distance is determined such that the edges of the transmitting regions overlap the crystallized regions.

For example, if the stage is moved in the X-axis direction such that the slit pattern 575 overlaps the discontinuous regions 580 of the crystallized silicon thin film 512', and if the second laser beam is irradiated onto the surface of the substrate 510 (as illustrated in FIG. 15B), then second crystallized patterns 512" are horizontally formed to overlap the discontinuous regions 580 of the first crystallized silicon thin film 512'. The second crystallized patterns 512" are identical in structure to the silicon thin film patterns 512' crystallized by the first crystallization.

The crystallization in the X-axis direction is completed by repeatedly performing the above method in the X-axis direction, as illustrated in FIG. 15C. The mask 570 or the stage is then moved a predetermined distance in the Y-axis direction (in the −Y-axis direction when the stage is moved). Then, a laser irradiating process is again performed on the portion on which the primary crystallizing process was performed in the horizontal direction.

When crystallization is repeatedly performed in the Y-axis direction using the above-described method, crystallization of an entire arbitrary region is achieved.

When using the inventive crystallization method in which the two-block mask is used, the crystallization time of the same area is shorter than the crystallization time of the related art technology. Therefore, the inventive process improves production yield.

Also, inverting the shapes of the mask pattern helps to alleviate the formation of areas that have different crystallization characteristics due to the diffraction of the laser beams. As a result, the overlap regions are reduced such that the crystallization characteristics of the crystallized silicon thin film are improved.

On the other hand, when using a sequential horizontal crystallizing processes in which a pulse duration extender (PDE) is applied, the size of the grains of the crystallized silicon thin film increases in accordance with the increase in slit distance. Therefore, the problem of the discontinuous regions in the edges of the crystallized silicon thin film (as described above) becomes severer. This is because the width and the length of the discontinuous regions increase in accordance with the increase in the size of the grains. Therefore when PDE is used, the present invention has larger effect where the size of grains increases.

A method of manufacturing a liquid crystal display using the silicon thin film with improved crystallization characteristics according to the invention will be described below.

Figure 16:
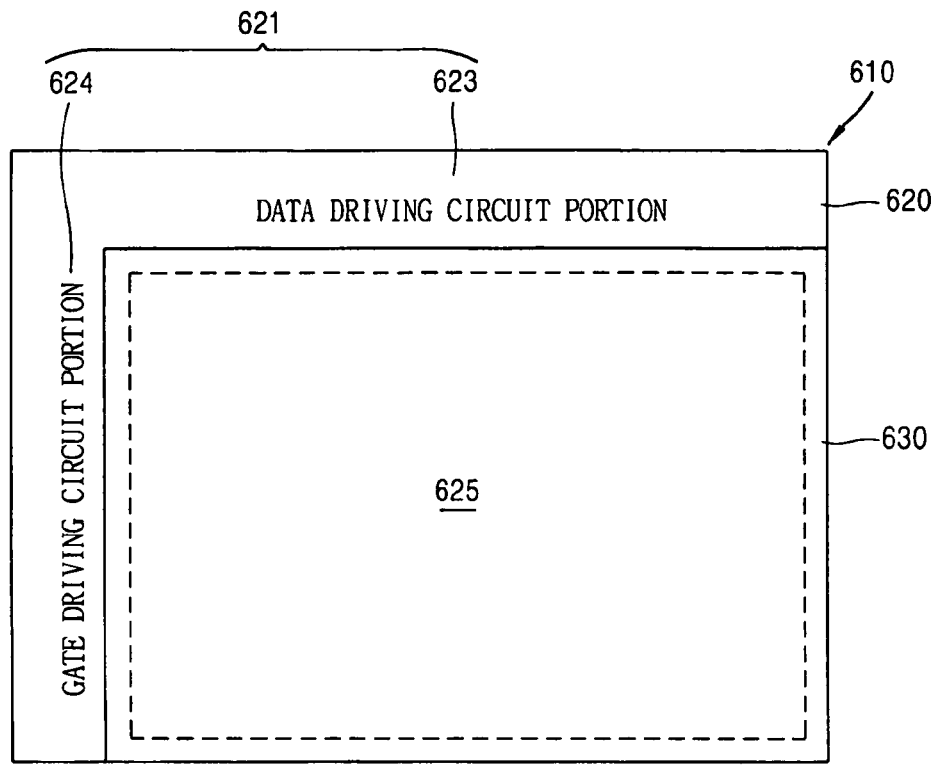
FIG. 16 shows a plan view schematically illustrating the structure of a liquid crystal display.

FIG. 16 shows a plan view schematically illustrating the structure of a liquid crystal display device. A liquid crystal display device integrated having a driving circuit portion integrated with an array substrate is illustrated.

As illustrated in FIG. 16, the integrated liquid crystal display device includes an array substrate 620, a color filter substrate 630, and a liquid crystal layer (not shown) formed between the array substrate 620 and the color filter substrate 630.

The array substrate 620 has a pixel portion 625 that is an image display region in which unit pixels are arranged in a matrix. A driving circuit portion 621 includes a gate driving circuit portion 624 and a data driving circuit portion 623 positioned outside the pixel portion 625.

Although not shown in the drawing, the pixel portion 625 of the array substrate 620 has multiple gate lines and data lines that are horizontally and vertically arranged on the array substrate 620 to define multiple pixel regions Thin film transistors (TFTs) that are switching elements are formed at the intersections between the gate lines and the data lines, and pixel electrodes are formed in the pixel regions.

The TFTs, switching elements that apply signal voltages to the pixel electrodes and that intercept the signal voltages from the pixel electrodes, are field effect transistors (FETs) that control the flow of current by using an electrical field.

Also, the driving circuit portions 623 and 624 of the array substrate 620 are arranged so that the data driving circuit portion 623 is positioned on the long side of the array substrate 620 that protrudes above the color filter substrate 630, and the gate driving circuit portion 624 is positioned on the short side of the array substrate 620.

The gate driving circuit portion 624 and the data driving circuit portion 623 use complementary metal oxide semiconductor (CMOS) TFTs, that are inverters, in order to properly output input signals.

The CMOS is a form of an integrated circuit of a MOS structure used for TFTs in the driving circuit portions, for which high speed signal processing is required, and which requires transistors having a P channel and an N channel. The speed and the density of the CMOS are somewhere between those of a NMOS and those of a PMOS.

The gate driving circuit portion 624 and the data driving circuit portion 623 are devices for supplying scanning signals and data signals to the pixel electrodes through the gate lines and the data lines. The gate driving circuit portion 624 and the data driving circuit portion 623 are connected to an external signal input port (not shown) to control external signals received through the external signal input port and to output the external signals to the pixel electrodes.

Also, although not shown in the drawing, in the image display region 625 of the color filter substrate 630, color filters for realizing colors and common electrodes that are counter-electrodes of the pixel electrodes formed in the array substrate 620 are formed.

A cell gap is provided between the array substrate and the color filter substrate such that the array substrate is separated from the color filter substrate by spacers by a predetermined distance. The array substrate and the color filter substrate attach to each other by a seal pattern formed outside the image display region to form a unitized liquid crystal display panel. The attachment of the two substrates is performed using an attachment key formed on the array substrate or on the color filter substrate.

Hereafter, a CMOS liquid crystal display device using the crystallized silicon thin film manufactured according to the invention, which is used for the liquid crystal display device integrated with driving circuits of the above structure, will be described in detail with reference to processes for manufacturing the same.

Figure 17:
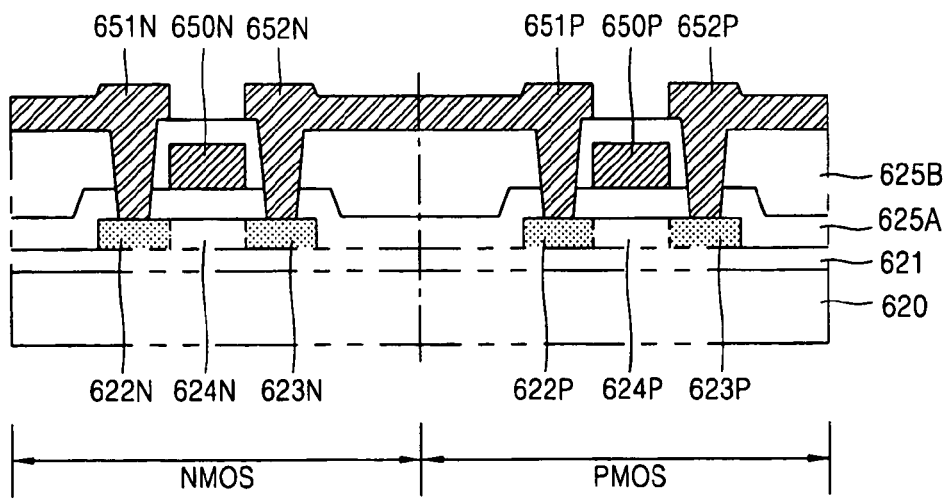
FIG. 17 illustrates a liquid crystal display device manufactured using the silicon thin film crystallized by the crystallization method according to the present invention.

FIG. 17 illustrates a CMOS liquid crystal display device manufactured using the silicon thin film crystallized by the inventive crystallization method.

N type or P type TFTs are formed in the pixel portions, and both the N type TFTs and the P type TFTs are formed in the driving circuit portions to form the CMOS. However, in the drawing, the method of manufacturing a CMOS liquid crystal display is illustrated for convenience.

The left side of FIG. 17 shows a method of manufacturing the NMOS that has the N type TFTs. The right side of FIG. 17 shows a method of manufacturing the PMOS that has P type TFTs.

First, a buffer layer 621 formed of a silicon oxide film ($SiO_2$) is formed over a substrate 620 formed of transparent insulating material.

Next, Active layers 624N and 624P formed of polycrystalline silicon are formed over the substrate 620 over which the buffer layer 621 is formed.

In the active layers 624N and 624P, after depositing an amorphous silicon thin film on the entire surface of the substrate 620, the amorphous silicon thin film is crystallized by the inventive lateral crystallization method using the laser mask having concave slits such that a polycrystalline silicon thin film is formed. Then, the crystallized polycrystalline silicon thin film is patterned by a photolithographic process such that active 624N and 624P patterns are respectively formed in the NMOS and PMOS regions.

Then, a gate insulating film 625A is deposited over the entire surface of the substrate 620 over which the active layers 624N and 624P are formed.

Next, gate electrodes 650N and 650P formed of Mo, Al, or an aluminum alloy are formed over a predetermined region (that is, the channel formation regions of the active layers 624N and 624P) of the substrate 620 on which the gate insulating film 625A is deposited.

After depositing gate metal over the entire surface of the substrate 620 over which the gate insulating film 625A is formed, the gate electrodes 650N and 650P are formed by a photolithography process.

Then, an N doping process and a P doping process are sequentially performed such that the N-type TFT (that is, the TFT in which source/drain regions 622N and 623N are formed by implanting N+ ions into a predetermined region of the active layer 624N) and the P-type TFT are formed.

At this time, the source region 622N and the drain region 623N of the N type TFT are formed by implanting a Group V element such as P that can provide electrons.

The source/drain regions 622P and 623P of the P type TFT are formed by implanting a Group III element such as B that can provide holes.

Next, after depositing an interlayer insulating film 625B over the entire surface of the substrate 620, contact holes (not shown) that expose parts of the source/drain regions 622N, 622P, 623N, and 623P are formed using a photolithography process.

Finally, source/drain electrodes 651N, 651P, 652N, and 652P that are electrically connected to the source/drain regions 622N, 622P, 623N, and 623P through the contact holes are formed to complete the CMOS liquid crystal display as illustrated in FIG. 17.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A laser mask comprising:
   a mask pattern that contains transmitting regions and a blocking region, and the mask pattern has edges having concave shapes inverted in consideration of diffraction of the laser mask and to convex shapes of edges of a silicon thin film crystallized using the laser mask to reduce overlap regions of the crystallized silicon thin film,
   wherein the transmitting regions of a slit pattern align such that two transmitting regions are formed on a left side of the laser mask and one transmitting region is formed on a right side of the laser mask to offset each other.

2. The laser mask according to claim 1, wherein one or more of the transmitting regions transmits laser beams.

3. The laser mask according to claim 2, wherein a plurality of block-shaped transmitting regions of the mask pattern are formed in the mask.

4. The laser mask according to claim 3, wherein the block-shaped transmitting regions of the mask pattern are arranged to offset each other.

5. The laser mask according to claim 1, wherein the blocking region is formed of a metal material that contains aluminum and blocks laser beams.

6. The laser mask according to claim 1, wherein the concave shapes include a concave triangle, a concave arc, or a concave rectangle.

* * * * *